US007875347B2

(12) United States Patent
Irwin et al.

(10) Patent No.: US 7,875,347 B2
(45) Date of Patent: *Jan. 25, 2011

(54) COMPOSITE COATINGS FOR GROUNDWALL INSULATION, METHOD OF MANUFACTURE THEREOF AND ARTICLES DERIVED THEREFROM

(75) Inventors: Patricia Chapman Irwin, Altamont, NY (US); Qi Tan, Rexford, NY (US); Abdelkrim Younsi, Ballston Lake, NY (US); Yang Cao, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 771 days.

This patent is subject to a terminal disclaimer.

(21) Appl. No.: 11/286,060

(22) Filed: Nov. 23, 2005

(65) Prior Publication Data

US 2007/0117911 A1    May 24, 2007
US 2009/0182088 A9    Jul. 16, 2009

Related U.S. Application Data

(63) Continuation-in-part of application No. 10/747,725, filed on Dec. 29, 2003, now Pat. No. 7,803,457.

(51) Int. Cl.
| B32B 5/16 | (2006.01) |
| B32B 15/08 | (2006.01) |
| B32B 19/02 | (2006.01) |
| B05D 3/02 | (2006.01) |
| B05D 5/12 | (2006.01) |
| B05D 1/02 | (2006.01) |
| B05D 1/18 | (2006.01) |
| B05D 1/28 | (2006.01) |

(52) U.S. Cl. .................. 428/323; 428/324; 428/325; 428/328; 428/329; 428/331; 428/332; 428/339; 428/447; 427/385.5; 427/427.4; 427/429; 427/430.1; 427/458

(58) Field of Classification Search .................. None
See application file for complete search history.

(56) References Cited

U.S. PATENT DOCUMENTS

| 5,552,222 | A | 9/1996 | Bolon |
| 5,650,031 | A | 7/1997 | Bolon et al. |
| 6,359,232 | B1* | 3/2002 | Markovitz et al. ......... 174/209 |
| 6,632,109 | B2 | 10/2003 | Irwin et al. |
| 6,703,780 | B2* | 3/2004 | Shiang et al. ............. 313/504 |
| 6,778,053 | B1 | 8/2004 | Irwin et al. |
| 6,864,306 | B2 | 3/2005 | Rao et al. |
| 7,041,148 | B2 | 5/2006 | Iorio et al. |
| 7,224,039 | B1* | 5/2007 | McGuire et al. ............ 257/532 |
| 7,268,293 | B2* | 9/2007 | Smith et al. .................. 174/36 |
| 2003/0017351 | A1 | 1/2003 | Hayashi et al. |
| 2003/0151030 | A1 | 8/2003 | Gurin |
| 2004/0084112 | A1 | 5/2004 | Verma et al. |
| 2004/0265551 | A1 | 12/2004 | Takaya et al. |
| 2005/0080175 | A1 | 4/2005 | Paik et al. |
| 2005/0142349 | A1* | 6/2005 | Irwin et al. ................. 428/323 |
| 2005/0161149 | A1 | 7/2005 | Yokota et al. |
| 2005/0208301 | A1* | 9/2005 | Okamoto et al. ........... 428/402 |
| 2005/0245644 | A1* | 11/2005 | Smith et al. ................ 523/400 |
| 2005/0277349 | A1* | 12/2005 | Smith et al. .................. 442/59 |

FOREIGN PATENT DOCUMENTS

| WO | 99/15595 | 4/1999 |
| WO | WO 01/89827 A1 | 11/2001 |

OTHER PUBLICATIONS

JP58141222. Publication Date Aug. 22, 1983. "High-Dielectric Film". (Abstract Only).
Colin Kydd Campbell. "Experimental and Theoretical Characterization of an Antiferroelectric Ceramic Capacitor for Power Electronics". IEEE Transactions on Components and Packaging Technologies, vol. 25, No. 2, pp. 211-216, Jun. 2002.
Jianwen Xu and C.P. Wong[a]. "Low-loss percolative dielectric composite" Applied Physics Letters 87, 082907, pp. 082907-1,2,3, 2005.
Y. Bai, Z.-Y. Cheng, V. Gharti, H.S. Xu, and Q.M. Zhang[a]. "High-dielectric-constant ceramic-powder polymer composites" Applied Physics Letters, vol. 76, No. 25, pp. 3804-3806, published Apr. 28, 2000.
E. Aulagner, J. Guillet, G. Seytre, C. Hantouche, P. Le Gonidec, G. Terzulli. "(PVDF/BatiO$_3$) and (PP/BaTiO$_3$) Films for Energy Storage Capacitors" 1995 IEEE 5th International Conference on Conduction and Breakdown in Solid Dielectrics. pp. 423-427. 1995.
D. Dimos. "Perovskite Thin Films for High-Frequency Capacitor Applications[1]". Annual Review of Materials Science. vol. 28: 397-419 (Volume publication date Aug. 1998).
Bowen, "Particle Size Distribution Measurement from Millimeters to Nanometers and from Rods to Platelets", Journal of Dispersion Science and Technology, 2002, pp. 631-662, vol. 23, No. 5.

\* cited by examiner

*Primary Examiner*—Monique R Jackson
(74) *Attorney, Agent, or Firm*—Ann M. Agosti

(57) ABSTRACT

Disclosed herein is an article comprising an electrical component; and an electrically insulating layer disposed upon the electrical component, wherein the electrically insulating layer comprises a thermosetting polymer and a nanosized filler; wherein the nanosized filler comprises metal oxide and diamond nanoparticles that have an average largest dimension of less than or equal to about 200 nanometers.

32 Claims, No Drawings

COMPOSITE COATINGS FOR GROUNDWALL INSULATION, METHOD OF MANUFACTURE THEREOF AND ARTICLES DERIVED THEREFROM

CROSS REFERENCE TO RELATED APPLICATIONS

This application is a continuation-in-part of U.S. patent application Ser. No. 10/747,725, filed Dec. 29, 2003 now U.S. Pat. No. 7,803,457.

BACKGROUND

This disclosure relates to composite coatings for groundwall insulation in electromagnetic devices such as motors, generators, and the like, methods of manufacture thereof, and articles derived therefrom.

Groundwall insulation for electrical components that are utilized in electrical devices has generally been manufactured from multilayered materials. Multiple layers facilitate a higher resistance to corona discharge. It is also desirable for the insulating layer to have a high value of breakdown voltage so that it can withstand the high voltage environment of electrical devices such as motors and generators. The multiple layers are generally comprised of a fibrous backing manufactured from glass as well as additional layers manufactured from mica. The use of multiple layers is both time-consuming as well as expensive. In addition, the use of multiple layers generally results in a thicker layer of insulation and consequently larger parts.

It is therefore generally desirable to use insulating layers that can be applied in a single step process and that can withstand higher voltages while have reduced thickness when compared with insulation that is made from multilayered materials.

SUMMARY

Disclosed herein is an article comprising an electrical component; and an electrically insulating layer disposed upon the electrical component, wherein the electrically insulating layer comprises a thermosetting polymer and a nanosized filler; wherein the nanosized filler comprises diamond nanoparticles, or a combination of metal oxide and diamond nanoparticles that have an average largest dimension of less than or equal to about 200 nanometers.

Disclosed herein too is a method of manufacturing an article comprising disposing an electrically insulating layer upon an electrical component, wherein the electrically insulating layer comprises a thermosetting polymer and a nanosized filler; wherein the nanosized filler comprises diamond nanoparticles, or a combination of metal oxide and diamond nanoparticles that have an average largest dimension of less than or equal to about 200 nanometers; and curing the thermosetting polymer.

Disclosed herein too is a composition comprising a thermosetting polymer and a nanosized filler; wherein the nanosized filler comprises diamond nanoparticles, or a combination of metal oxide and diamond nanoparticles that have an average largest dimension of less than or equal to about 200 nanometers.

Disclosed herein too is a method comprising feeding a stator bar into a central bore of a die, wherein the central bore is of a configuration sufficient to allow relative movement of the die over the stator bar; extruding an insulating layer into the die so that it is deposited simultaneously onto each side of the stator bar; wherein the insulating layer comprises a thermosetting polymer and a nanosized filler; wherein the nanosized filler comprises diamond nanoparticles, or a combination of metal oxide and diamond nanoparticles that have an average largest dimension of less than or equal to about 200 nanometers; and traversing the die along an entire length of the stator bar.

DETAILED DESCRIPTION OF PREFERRED EMBODIMENTS

It is to be noted that the terms "first," "second," and the like as used herein do not denote any order, quantity, or importance, but rather are used to distinguish one element from another. The terms "a" and "an" do not denote a limitation of quantity, but rather denote the presence of at least one of the referenced item. The modifier "about" used in connection with a quantity is inclusive of the stated value and has the meaning dictated by the context (e.g., includes the degree of error associated with measurement of the particular quantity). It is to be noted that all ranges disclosed within this specification are inclusive and are independently combinable.

Disclosed herein is an insulating layer that may be used to protect and insulate electrical components of electrical devices such as motors, generators, and the like. Disclosed herein too, is a method for applying the insulating layer onto electrical components that may be utilized in electrical devices. Suitable examples of such electrical components are electrical conduction windings, stator bars, or on the inside of a stator piece, or the like. The insulating layer generally comprises a thermosetting polymer and a nanosized filler. In one embodiment, the nanosized fillers comprise a combination of metal oxides and diamonds. In another embodiment, the nanosized fillers comprise diamonds. The nanosized fillers can also optionally include nanosized mineral fillers and/or nanoclays.

The insulating layer is advantageous in that it can be applied to the electrical components in thicknesses of about 30 to about 300 micrometers, which is generally less than or equal to the thickness of other commercially available insulating layers. The insulating layer advantageously has a compressive strength and hardness effective to withstand a compressive force of about 250 to about 1000 mega-Pascals (MPa). Application of the insulating layer also provides an opportunity for excluding the tape wound, micaeous and polymeric groundwall insulation or slot liner material that is generally used in electrical devices. The insulating layer can be easily applied in a single step process such as dip coating, spray painting, extrusion, coextrusion, or the like. It also provides the potential for thinner insulation layers and provides a more robust insulation material because of its ability to withstand higher voltages. It also displays a significant corona resistance compared with other comparative insulating materials that do not contain nanosized fillers and improved thermal conductivity.

In one advantageous embodiment, the insulating layer comprises an elastomer having a modulus of elasticity of less than or equal to about $10^5$ gigapascals (GPa) at room temperature. The elastomer generally comprises a thermosetting polysiloxane resin and a nanosized filler. The elastomeric insulating layer advantageously displays an elongation of greater than or equal to about 200% in a tensile test at room temperature while at the same time displaying no substantial creep when subjected to a compressive or tensile force at prevailing temperatures in an electrical generator.

The thermosetting polymer generally comprises a polymer that may be a homopolymer, a copolymer such as a star block copolymer, a graft copolymer, an alternating block copolymer or a random copolymer, ionomer, dendrimer, or a combination comprising at least one of the foregoing polymers that may be covalently crosslinked. Suitable examples of thermosetting polymers are polyurethanes, epoxies, phenolics, silicones, polyacrylics, polycarbonates polystyrenes, polyesters, polyamides, polyamideimides, polyarylates, polyarylsulfones, polyethersulfones, polyphenylene sulfides, polysulfones, polyimides, polyetherimides, polytetrafluoroethylenes, polyetherketones, polyether etherketones, polyether ketone ketones, polybenzoxazoles, polyoxadiazoles, polybenzothiazinophenothiazines, polybenzothiazoles, polypyrazinoquinoxalines, polypyromellitimides, polyquinoxalines, polybenzimidazoles, polyoxindoles, polyoxoisoindolines, polydioxoisoindolines, polytriazines, polypyridazines, polypiperazines, polypyridines, polypiperidines, polytriazoles, polypyrazoles, polycarboranes, polyoxabicyclononanes, polydibenzofurans, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, polybutadienes, polyisoprenes, or the like, or a combination comprising at least one of the foregoing thermosetting polymers. Blends of thermosetting polymers may also be utilized. An exemplary thermosetting polymer is a silicone polymer. The term polymer as used herein is used to mean either a small molecule (e.g., monomer, dimer, trimer, and the like), a homopolymer or a copolymer.

As noted above, the thermosetting polymer can be an elastomer. Examples of thermosetting polymers are polybutadienes, polyisoprenes, polysiloxanes, polyurethanes, or the like, or a combination comprising at least one of the foregoing elastomers. An exemplary thermosetting polymer is a polysiloxane polymer (hereinafter silicone polymer).

The silicone polymers that may be used in the preparation of the insulating layer generally has the formula (I) prior to reacting to form the thermoset

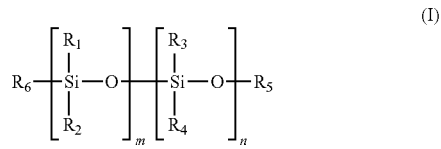

(I)

wherein $R_1$, $R_2$, $R_3$, $R_4$, $R_5$ and $R_6$ may be the same or different and wherein at least one of $R_1$, $R_2$, $R_3$, $R_4$, $R_5$ and $R_6$ is a reactive functionality prior to cross linking; m and n can be any integer including 0, with the exception that both m and n cannot be 0 at the same time. In general, while it is preferred for at least one of $R_1$, $R_2$, $R_3$, $R_4$, $R_5$ and $R_6$ to be reactive, it is generally desirable for two or preferably three of $R_1$, $R_2$, $R_3$, $R_4$, $R_5$ or $R_6$ to be chemically reactive. It is generally desirable for the sum of m and n to be about 1 to about 50,000. Suitable examples of groups that may be present as $R_1$, $R_2$, $R_3$, $R_4$, $R_5$ or $R_6$ in the equation (I) are alkyl, aryl, aralkyl, fluoroalkyl, vinylalkyl, aminoalkyl, vinyl, epoxy, hydride, silanol, amine, carbinol (hydroalkyl), methacrylate, acrylate, mercapto, haloalkyl, halogen, carboxylate, acetoxy, alkoxy, or the like. Exemplary reactive functional groups are vinyl or epoxy. Exemplary non-reactive functional groups are alkyl, fluoroalkyl or phenyl. An exemplary silicone polymer is a condensation cure silicone having methyl, phenyl and hydroxyl functional groups. One of the commercially available silicone polymer is MC 550 BKH® commercially available from General Electric Silicones in Waterford, N.Y. MC 550 BKH® contains 78 wt % of a reinforcing agent. The reinforcing agent is not nanosized and comprises fused silica and fiberglass in a weight ratio of 80:20. Nanosized fillers of interest are then added to this material.

It is generally desirable for the thermosetting polymer to have a number average molecular weight of about 75 to about 500,000 grams/mole (g/mole) prior to reacting to form the thermosetting polymer. In one embodiment, it is generally desirable for the thermosetting polymer to have a number average molecular weight of about 150 to about 100,000 g/mole prior to reacting to form the thermosetting polymer. In another embodiment, it is generally desirable for the thermosetting polymer to have a number average molecular weight of about 300 to about 75,000 g/mole prior to reacting to form the thermosetting polymer. In yet another embodiment, it is generally desirable for the thermosetting polymer to have a number average molecular weight of about 450 to about 50,000 g/mole prior to reacting to form the thermosetting polymer. An exemplary number average molecular weight of the thermosetting polymer is about 75 to about 5,000 g/mole prior to reacting to form the thermosetting polymer.

It is generally desirable to use the thermosetting polymer in an amount of about 50 to 98 wt %, based on the total weight of the insulating layer. In one embodiment, it is desirable to use the thermosetting polymer in an amount of about 55 to about 90 wt %, based on the total weight of the insulating layer. In another embodiment, it is desirable to use the thermosetting polymer in an amount of about 60 to about 85 wt %, based on the total weight of the insulating layer. In yet another embodiment, it is desirable to use the thermosetting polymer in an amount of about 65 to about 80 wt %, based on the total weight of the insulating layer.

The thermosetting polymer may optionally be mixed with reactive precursors such as silanes in order to increase the crosslink density. Suitable silanes are chlorosilanes, vinylsilanes, vinylalkoxysilanes, aklylacetoxysilanes, and the like. Suitable examples of chlorosilanes are methyltrichlorosilane and dimethyldichlorosilane. It is generally desirable for the dimethyldichlorosilane to have about 1 to about 35 mole percent of hydroxyl groups. In one embodiment, it is desirable for the dimethyldichlorosilane to have about 2 to about 15 mole percent of hydroxyl groups. In one embodiment, it is desirable for the dimethyldichlorosilane to have about 4 to about 8 mole percent of hydroxyl groups.

It is generally desirable to use the reactive precursor in an amount of about 0.1 to 50 wt %, based on the total weight of the thermosetting polymer. In one embodiment, it is desirable to use the reactive precursor in an amount of about 0.5 to about 40 wt %, based on the total weight of the thermosetting polymer. In another embodiment, it is desirable to use the reactive precursor in an amount of about 1 to about 30 wt %, based on the total weight of the thermosetting polymer. In yet another embodiment, it is desirable to use the reactive precursor in an amount of about 1.2 to about 25 wt %, based on the total weight of the thermosetting polymer.

The insulating layer may optionally contain a reinforcing agent that is not nanosized. The reinforcing agent is a filler having particle dimensions of greater than or equal to about 500 nanometers (nm). Suitable reinforcing agents are silica powder, such as fused silica, crystalline silica, natural silica sand, and various silane-coated silicas; talc, including fibrous, modular, needle shaped, and lamellar talcs; glass spheres, both hollow and solid, and surface-treated glass spheres; kaolin, including hard, soft, and calcined kaolin;

mica, including metallized mica and mica surface treated with aminosilanes, acryloylsilanes, hexamethylenedisilazane, or coatings having a chemical composition similar to the thermosetting polymer so as to impart good physicals to compounded blends; feldspar and nepheline syenite; silicate spheres; cenospheres; fillite; aluminosilicate (armospheres), including silanized and metallized aluminosilicate; quartz; quartzite; perlite; tripoli; diatomaceous earth; silicon carbide; molybdenum sulfide; zinc sulfide; aluminum silicate (mullite); synthetic calcium silicate; zirconium silicate; barium titanate; barium ferrite; barium sulfate and heavy spar; flaked fillers and reinforcements such as glass flakes, flaked silicon carbide, aluminum diboride; processed mineral fibers such as those derived from blends comprising at least one of aluminum silicates, aluminum oxides, magnesium oxides, and calcium sulfate hemihydrate; synthetic reinforcing fibers, including polyester fibers such as polyethylene terephthalate fibers, polyvinylalcohol fibers, aromatic polyamide fibers, polybenzimidazole fibers, polyimide fibers, polyphenylene sulfide fibers, polyether ether ketone fibers, boron fibers, ceramic fibers such as silicon carbide, fibers from mixed oxides of aluminum, boron and silicon; single crystal fibers or "whiskers" including silicon carbide fibers, alumina fibers, boron carbide fibers, glass fibers, including textile glass fibers such as E, A, C, ECR, R, S, D, and NE glasses, fiber glass and quartz; or the like, or a combination comprising at least one of the foregoing reinforcing agents.

Exemplary reinforcing agents are fused silica and fiber glass. It is generally desirable for the weight ratio of fused silica to fiber glass to be about 1:5 to about 10:1. In one embodiment, the weight ratio of fused silica to fiber glass is about 1:3 to about 8:1. In another embodiment, the weight ratio of fused silica to fiber glass is about 1:1 to about 6:1. An exemplary weight ratio of fused silica to fiber glass is about 4:1.

When present, the reinforcing agent is used in amounts of about 20 to about 90 wt %, based on the total weight of the insulating layer. In one embodiment, it is desirable for the reinforcing agent to be used in amounts of about 30 to about 85 wt %, based on the total weight of the insulating layer. In another embodiment, it is desirable for the reinforcing agent to be used in amounts of about 50 to about 80 wt %, based on the total weight of the insulating layer. An exemplary amount of reinforcing agent is about 78 wt %, based on the total weight of the insulating layer.

As stated above, the insulating layer comprises nanosized fillers. The nanosized fillers are those having an average largest dimension of at least one characteristic length of the particle being less than or equal to about 200 nm. A characteristic length may be a diameter, edge of a face, length, or the like. The nanosized fillers may have shapes whose dimensionalities are defined by integers, e.g., the particles are either 1, 2 or 3-dimensional in shape. They may also have shapes whose dimensionalities are not defined by integers (e.g., they may exist in the form of fractals). The nanosized fillers may exist in the form of spheres, flakes, fibers, whiskers, or the like, or a combination comprising at least one of the foregoing forms. These fillers may have cross-sectional geometries that may be circular, ellipsoidal, triangular, rectangular, polygonal, or a combination comprising at least one of the foregoing geometries. The fillers, as commercially available, may exist in the form of aggregates or agglomerates prior to incorporation into the insulating layer or even after incorporation into the insulating layer. An aggregate comprises more than one filler particle in physical contact with one another, while an agglomerate comprises more than one aggregate in physical contact with one another.

In one embodiment, the nanosized fillers comprise diamond nanoparticles having an average particle size of less than or equal to about 200 nanometers. In another embodiment, the diamond nanoparticles have an average particle size of less than or equal to about 75 nanometers. In yet another embodiment, the diamond nanoparticles have an average particle size of less than or equal to about 50 nanometers. In yet another embodiment, the diamond nanoparticles have an average particle size of less than or equal to about 25 nanometers. Exemplary nanosized fillers are diamond nanoparticles having an average particle size of about 50 nanometers.

The diamond nanoparticles can be added in an amount of about 1 to about 50 wt %, based upon the total weight of the insulating layer. In another embodiment, the diamond nanoparticles can be added in an amount of about 3 to about 40 wt %, based upon the total weight of the insulating layer. In yet another embodiment, the diamond nanoparticles can be added in an amount of about 5 to about 30 wt %, based upon the total weight of the insulating layer. An exemplary amount of diamond nanoparticles is about 15 wt %, based upon the total weight of the insulating layer.

As noted above, the nanosized fillers comprise either diamond nanoparticles or a combination of metal oxides nanoparticles (nanosized metal oxides) and diamond nanoparticles. In one embodiment, the nanosized metal oxides can be in the form of ceramics (i.e., chemically or mechano-chemically synthesized metal oxide powder). Nanosized metal oxides that may be used in the insulating layer are metal oxides of alkali earth metals, alkaline earth metals, transition metals and other commercially used metals. Suitable examples of metal oxides are calcium oxide, cerium oxide, magnesium oxide, titanium oxide, zinc oxide, silicon oxide, copper oxide, aluminum oxide (e.g., alumina and/or fumed alumina), silicon dioxide (e.g., silica and/or fumed silica), or the like, or a combination comprising at least one of the foregoing metal oxides. Nanosized metal carbides such as silicon carbide, titanium carbide, tungsten carbide, iron carbide, or the like, or a combination comprising at least one of the foregoing metal carbides may also be used in the insulating layer. Exemplary metal oxides are fumed alumina, alumina, fumed silica, silica and combinations comprising at least one of the foregoing metal oxides.

The metal oxides and carbides are generally particles having surface areas in an amount of about 1 to about 1000 square meter/gram ($m^2/g$). Within this range it is generally desirable for the metal oxides and carbides to have surface areas greater than or equal to about 5 $m^2/g$, specifically greater than or equal to about 10 $m^2/g$, and more specifically greater than or equal to about 15 $m^2/g$. Also desirable within this range is a surface area less than or equal to about 950 $m^2/g$, specifically less than or equal to about 900 $m^2/g$, and more specifically less than or equal to about 875 $m^2/g$.

It is generally desirable for the nanosized metal oxide and carbide particles to have bulk densities in an amount of about 0.2 to about 2.5 grams per cubic centimeter; true densities in an amount of about 3 to about 7 grams per cubic centimeter and an average pore diameter of about 10 to about 250 angstroms.

Commercially available examples of nanosized metal oxides are NANOACTIVE™ calcium oxide, NANOACTIVE™ calcium oxide plus, NANOACTIVE™ cerium oxide, NANOACTIVE™ magnesium oxide, NANOACTIVE™ magnesium oxide plus, NANOACTIVE™ titanium oxide, NANOACTIVE™ zinc oxide, NANOACTIVE™ silicon oxide, NANOACTIVE™ copper oxide, NANOACTIVE™ aluminum oxide, NANOACTIVE™ aluminum oxide plus, all commercially available from NanoScale Materials Incorporated. Commercially available examples of nanosized metal carbides are titanium carbonitride, silicon carbide, silicon carbide-silicon nitride, and tungsten carbide all commercially available from Pred Materials International Incorporated.

An exemplary type of nanosized fillers are the ferritic nanosized particles represented by the formula (II):

$$(MeO)_x.(Fe_2O_3)_{100-x} \qquad (II)$$

where "MeO" is any divalent ferrite forming metal oxide or a combination comprising two or more divalent metal oxides, and "x" is less than 50 mole percent. Suitable examples of ferrite forming divalent metal oxides are iron oxide (FeO), manganese oxide (MnO), nickel oxide (NiO), copper oxide (CuO), zinc oxide (ZnO), cobalt oxide (CoO), magnesium oxide (MgO), calcium oxide (CaO), ceria ($Ce_2O_3$), or the like. Single metal oxides, multi-metal oxides, doped oxides are also envisioned for use in the insulating layer.

Suitable examples of commercially available ferrite forming metal oxides are zinc oxide having average largest dimensions of 30 nm and 80 nm. All of the foregoing commercially available ferrite forming metal oxides may be obtained from Advanced Powder Technology based in St. Welshpool in Australia.

Other examples of commercially available metal oxides are ceria having a particle size of less than or equal to about 20 mm; gadolinium doped ceria having particle sizes of less than or equal to about 20 nm; samarium doped ceria having particle sizes of less than or equal to about 20 nm; or the like, or a combination comprising at least one of the foregoing commercially available metal oxides. All of the foregoing commercially available ferrite forming metal oxides comprising ceria may be obtained from Microcoating Technologies based in Atlanta, Ga.

A suitable example of commercially available ferritic nanosized fillers is $Ni_{0.5}Zn_{0.5}Fe_2O_4$ manufactured and sold by NanoProducts, Inc. The crystallite size for the $Ni_{0.5}Zn_{0.5}Fe_2O_4$ is 12 nm, specific surface area is 45 square meter/gram ($m^2/g$) and the equivalent spherical diameter is 47 nm.

When ferritic nanosized fillers are used, they may be used in amounts of about 2 to about 15 wt %, based on the total weight of the insulating layer. In one embodiment, the ferritic nanosized fillers are used in amounts of about 3 to about 12 wt %, based on the total weight of the insulating layer. In another embodiment, the ferritic nanosized fillers are used in amounts of about 4 to about 12 wt %, based on the total weight of the insulating layer. In an exemplary embodiment, the ferritic nanosized fillers are used in amounts of about 5 wt %, based on the total weight of the insulating layer.

Suitable examples of other nanosized fillers are nanosized mineral fillers such as asbestos, ground glass, kaolin and other clay minerals, silica, calcium silicate, calcium carbonate (whiting), magnesium oxide, zinc oxide, aluminum silicate, calcium sulfate, magnesium carbonate, sodium silicate, barium carbonate, barium sulfate (barytes), mica, talc, alumina trihydrate, quartz, and wollastonite (calcium silicate). Mica is an exemplary nanosized mineral filler.

Examples of mica that may be used are anandite, annite, biotite, bityte, boromuscovite, celadonite, chernikhite, clintonite, ephesite, ferri-annite, glauconite, hendricksite, kinoshitalite, lepidolite, masutomilite, muscovite, nanpingite, paragonite, phlogopite, polylithionite, preiswerkite, roscoelite, siderophillite, sodiumphlogopite, taeniolite, vermiculite, wonesite, and zinnwaldite.

Exemplary forms of mica are phlogopite ($KMg_3AlSi_3O_{10}(OH)_2$) or muscovite ($K_2Al_4[Si_6Al_2O_{20}](OH,F)_4$). The phlogopite or muscovite or both are subjected to a process in which they are heated to an elevated temperature of about 500 to about 850° C. This heat causes the mica crystals to partially dehydrate and release a portion of the water, which is bonded naturally in the crystal. When this occurs, the mica partially exfoliates, resulting in smaller particles. The mica is then ground to produce small nanosized filler particles. A suitable from of commercially available mica is mica dust from Von-Roll Isola.

Nanosized fillers such as nanoclays (nanosized clays) may also be used in the insulating layer. Nanoclays are generally plate-like materials, the clay mineral being generally selected from smectite, vermiculite and halloysite clays. The smectite clay in turn can be selected from montmorillonite, saponite, beidellite, nontrite, hectorite or the like, or a combination comprising at least one of the foregoing clays. An exemplary clay mineral is the montmorillonite clay, a multilayered alumino-silicate. The nanoclay platelets generally have a thickness of about 3 to about 3000 angstroms and a size in the planar direction ranging of about 0.01 to about 100 micrometers. The aspect ratio of the nanoclays is generally of the order of about 10 to about 10,000. The respective clay platelets are separated by a gallery, i.e., a space between parallel layers of clay platelets containing various ions holding the platelets together. One such material is CLOISITE®10A commercially available from Southern Clay Products, its platelets having a thickness of about 0.001 micrometers (10 angstroms) and a size in the planar direction of about 0.15 to about 0.20 micrometers.

In one embodiment, a combination of nanosized fillers, nanosized mineral fillers and/or nanoclays may be used in the insulating layer. When such a combination is used, it may be added to the insulating layer in an amount of about 1 to about 80 wt %, based on the total weight of the insulating layer. In one embodiment, the combination of nanosized fillers, nanosized mineral fillers and/or nanoclays may be used in an amount of about 2 to about 75 wt %, based on the total weight of the insulating layer. In another embodiment, the combination of nanosized fillers, nanosized mineral fillers and/or nanoclays may be used in an amount of about 3 to about 70 wt %, based on the total weight of the insulating layer. An exemplary insulating layer is one having metal oxide nanosized fillers in an amount of about 5 wt %, based upon the total weight of the insulating layer. Another exemplary insulating layer is one having mica dust in an amount of about 20 wt %, based upon the total weight of the insulating layer.

In one embodiment, it may be desirable to add nanosized fillers of a particular chemical composition to the insulating layer along with micrometer sized fillers of the same chemical composition. In general, the micrometer sized fillers have average largest dimensions of greater than or equal to about 500 nm. For example mica dust having nanosized particle of an average largest dimension of less than or equal to about 200 nm may be added to the insulating layer in conjunction with micrometer sized mica dust having an average particle sizes of about 50 micrometers.

In general when nanosized fillers are used in conjunction with micrometer sized fillers having the same chemical composition, it is generally desirable for the nanosized filler to constitute up to about 50 wt %, more specifically up to about 60 wt %, and even more specifically up to about 70 wt %, based on the total weight of combination of nanosized and micrometer sized fillers.

As stated above, there is no particular limitation to the shape of the nanosized fillers, which may be for example, spherical, irregular, plate-like or whisker like. The nanosized fillers may generally have average largest dimensions of at least one characteristic length being less than or equal to about 200 nm. In one embodiment, the nanosized fillers may have average largest dimensions of less than or equal to about 150 nm. In another embodiment, the nanosized fillers may have average largest dimensions of less than or equal to about 100 nm. In yet another embodiment, the nanosized fillers may have average largest dimensions of less than or equal to about 75 nm. In yet another embodiment, the nanosized fillers may have average largest dimensions of less than or equal to about 50 nm.

As stated above, the nanosized fillers may generally have average largest dimensions of less than or equal to about 200 nm. In one embodiment, more than 90% of the nanosized fillers have average largest dimensions less than or equal to about 200 nm. In another embodiment, more than 95% of the nanosized fillers have average largest dimensions less than or equal to about 200 nm. In yet another embodiment, more than 99% of the nanosized fillers have average largest dimensions less than or equal to about 200 nm. Bimodal or higher particle size distributions may also be used.

The nanosized fillers may be used in amounts of about 1 to about 80 wt %, based on the total weight of the insulating layer. In one embodiment, the nanosized fillers may be used in amounts of about 3 to about 75 wt %, based on the total weight of the insulating layer. In another embodiment, the nanosized filler particles may be used in amounts of about 5 to about 70 wt %, based on the total weight of the insulating layer. In yet another embodiment, the nanosized filler particles may be used in amounts of about 6 to about 60 wt %, based on the total weight of the insulating layer. In an exemplary embodiment, the nanosized filler particles may be used in an amount of about 20 wt % based on the total weight of the insulating layer.

In one embodiment, the nanosized fillers may be coated with a silane-coupling agent to facilitate bonding with the thermosetting polymer. It is generally desirable for the fillers utilized in the curable polymeric resin coating to be treated with a silane-coupling agent such as tetramethylchlorosilane, hexadimethylenedisilazane, gamma-aminopropoxysilane, or the like, or a combination comprising at least one of the foregoing silane coupling agents. The silane-coupling agents generally enhance compatibility of the nanosized filler with the thermosetting polymer and improve the mechanical properties of the insulating layer.

Solvents may optionally be used in the insulating layer. The solvent may be used as a viscosity modifier, or to facilitate the dispersion and/or suspension of nanosized filler. Liquid aprotic polar solvents such as propylene carbonate, ethylene carbonate, butyrolactone, acetonitrile, benzonitrile, nitromethane, nitrobenzene, sulfolane, dimethylformamide, N-methylpyrrolidone, or the like, or a combination comprising at least one of the foregoing solvents are generally desirable. Polar protic solvents such as, but not limited to, water, methanol, acetonitrile, nitromethane, ethanol, propanol, isopropanol, butanol, or the like, or a combination comprising at least one of the foregoing polar protic solvents may be used. Other non-polar solvents such a benzene, toluene, methylene chloride, carbon tetrachloride, hexane, diethyl ether, tetrahydrofuran, or the like, or a combination comprising at least one of the foregoing solvents may also be used. Co-solvents comprising at least one aprotic polar solvent and at least one non-polar solvent may also be utilized. An exemplary solvent is xylene or N-methylpyrrolidone.

If a solvent is used, it may be utilized in an amount of about 1 to about 50 wt %, of the total weight of the insulating layer. In one embodiment, if a solvent is used, it may be utilized in an amount of about 3 to about 30 wt %, of the total weight of the insulating layer. In yet another embodiment, if a solvent is used, it may be utilized in an amount of about 5 to about 20 wt %, of the total weight of the insulating layer. It is generally desirable to evaporate the solvent before, during and/or after the curing of the thermosetting polymer.

In one method of manufacturing the insulating layer, the thermosetting polymer is blended with the nanosized filler under high levels of shear in order to facilitate mixing. The level of shear imparted to the mixture of the thermosetting polymer and the nanosized filler is effective to facilitate dispersion of the filler in the thermosetting polymer. The energy imparted during the shearing process is about 0.001 kilowatt-hour/kilogram (kWhr/kg) to about 10 kWhr/kg. In one embodiment, the energy imparted during the shearing process is about 0.01 to about 8 kWhr/kg. In another embodiment, the energy imparted during the shearing process is about 0.1 to about 6 kWhr/kg. In yet another embodiment, the energy imparted during the shearing process is about 0.5 to about 4 kWhr/kg.

The shear may be imparted in a melt blending process or it may be imparted via other means such as the application of ultrasonic energy to the mixture. Suitable examples of melt blending equipment are extruders such as single screw extruders, twin screw extruders, or the like; buss kneaders, roll mills, paint mills, helicones, Waring blenders, Henschel mixers, Banbury's, or the like, or a combination comprising at least one of the foregoing melt blenders. Ultrasonic blending may also be carried out to facilitate the suspension and/or dispersion of the nanosized filler in the thermosetting polymer. In order to facilitate the suspension of the nanosized filler, it is desirable that both aggregates and agglomerates are broken into smaller particles.

As stated above, the insulating layer is disposed upon electrical components such as electrical conduction windings or stator bars or on the inside of a stator piece, and subjected to curing. In one embodiment, the electrical component comprises copper. An initiator and/or crosslinking catalyst may be added to the mixture of the thermosetting polymer and the nanosized filler prior to or during the disposition of the insulating layer upon the winding. The insulating layer may be applied to the winding via dip coating, spray painting, electrostatic painting, brush painting, spin coating, injection molding, coextrusion or the like, or a combination comprising at least one of the foregoing processes.

In one embodiment, the insulating layer may be disposed upon a electrical components such as electrical conduction windings or stator bars or on the inside of a stator piece in several steps. For example, an insulating layer of a certain thickness may be disposed upon the electrical components in a first step, while a second insulating layer of another thickness is disposed upon the first layer in a second step. In one embodiment, the first insulating layer may have a different composition from the second insulating layer. The insulating layers may then be subjected to a heat treatment or to electromagnetic radiation such as UV curing and/or microwave curing to facilitate a more effective crosslinking.

In one exemplary embodiment, an insulating layer comprising the thermosetting resin can be extruded onto a complex shape such as that of a stator bar. As noted above, the insulating layer comprises a thermosetting polymer and a nanosized filler; wherein the nanosized filler comprises metal oxide and diamond nanoparticles that have an average largest dimension of less than or equal to about 200 nanometers. The method comprises feeding the complex shape with a length and more than one side into a central bore of a die wherein the central bore is of a configuration sufficient to allow the die to be moved along the complex shape or for the complex shape to be moved along through the die. At least one thermosetting material comprising the aforementioned nanoparticles is extruded through the die so that the thermosetting material is deposited simultaneously onto each side of the complex shape. In one embodiment, the die is traversed along the entire length of the complex shape. In another embodiment, the entire length of the complex shape is permitted to travel through the die so that it is coated with the insulating layer.

An exemplary apparatus for applying the insulating layer is described in U.S. Pat. No. 5,650,031 to Bolon et al., the entire contents of which is hereby incorporated by reference except in those cases where a term in the present application contradicts a term from the incorporated reference, in which event the term from the present application takes precedence over the conflicting term from the incorporated reference. The apparatus comprises a die having a central bore, wherein the central bore is of a configuration sufficient to allow the die to be moved along a complex shape with a plurality of sides and a length, and through which the complex shape is fed. The apparatus also comprises a means of traversing the extrusion die along the length of the complex shape, and at least one extruder connected to the die by flexible coupling means.

In one embodiment, the thermosetting polymer in the insulating layer may be subjected to curing at a temperature of about 100° C. to about 250° C. In another embodiment, the insulating layer may be cured at a temperature of about 120° C. to about 220° C. In yet another embodiment, the insulating layer may be cured at a temperature of about 140° C. to about 200° C. In an exemplary embodiment, the insulating layer may be cured at a temperature of about 180° C.

It is generally desirable to have an insulating layer having a thickness of about 25 to about 300 micrometers (μm). In one embodiment, it is desirable for the insulating layer to have a thickness of about 30 to about 275 μm. In another embodiment, it is desirable for the insulating layer to have a thickness of about 40 to about 250 μm. In yet another embodiment, it is desirable for the insulating layer to have a thickness of about 50 to about 225 μm.

The insulating layer is advantageous in that it has a breakdown voltage of greater than or equal to about 0.75 kilovolt (kV) at a thickness of about 25 to about 300 μm. In one embodiment, the breakdown voltage for the insulating layer is greater than or equal to about 2 kV. In yet another embodiment, the breakdown voltage for the insulating layer is greater than or equal to about 3 kV. In yet another embodiment, the breakdown voltage for the insulating layer is greater than or equal to about 4 kV.

In one embodiment, the insulating layer has an electrical breakdown strength of greater than or equal to about 1 kilovolt and is corona resistant to an applied voltage of 5000 Volts at a frequency of 3 kilohertz for a time period of over 100 minutes. In another embodiment, the insulating layer has an electrical breakdown strength of greater than or equal to about 1 kilovolt and is corona resistant to an applied voltage of 5000 Volts at a frequency of 3 kilohertz for a time period of over 200 minutes.

The insulating layer is advantageous in that it can be applied to the electrical components in thicknesses of about 30 to about 300 micrometers, which is generally less than or equal to other commercially available insulating layers. The insulating layer advantageously has a compressive strength and hardness effective to withstand a compressive force of about 250 to about 1000 mega-Pascals (MPa). Application of the insulating layer also provides an opportunity for excluding the tape wound micaeous combined with polymeric groundwall insulation or slot liner material that is generally used in electrical devices.

As noted above, in one advantageous embodiment, the insulating layer can comprise a thermosetting polymer that displays elastomeric behavior at room temperature. When the thermosetting polymer displays elastomeric behavior at room temperature is used in the insulation, it is desirable for the insulating layer to have an elastic modulus of less than or equal to about $10^5$ GPa when measured in a tensile test at room temperature. The insulating layer has an elongation to break of greater than or equal to about 200%. In one embodiment, the insulating layer has an elongation to break of greater than or equal to about 300%. In another embodiment, the insulating layer has an elongation to break of greater than or equal to about 500%. In yet another embodiment, the insulating layer has an elongation to break of greater than or equal to about 700%.

It is desirable for the insulating layer to display substantially no creep when subjected to tensile or compressive stresses at temperatures that are greater than or equal to about room temperature (23° C.) up to about 2000 hours. In one embodiment, the insulating layer displays a creep of less than 10% of its original length when subjected to a tensile or compressive force of greater than or equal to about 100 kilograms/square centimeter for a time period of up to about 2000 hours at room temperature. In another embodiment, the insulating layer displays a creep of less than 15% of its original length when subjected to a tensile or compressive force of greater than or equal to about 100 kilograms/square centimeter for a time period of up to about 2000 hours at room temperature.

In another embodiment, the insulating layer displays a creep of less than or equal to about 10% of its original length when subjected to a deforming force of 10 kilo-pounds per square inch (10 kpsi) (about 700 kilogram-force/square centimeter) for 1000 hours at 155° C. In yet another embodiment, the insulating layer displays a creep of less than or equal to about 6% when subjected to a deforming force of 10 kilo-pounds per square inch (10 kpsi) (about 700 kilogram-force/square centimeter) for 1000 hours at 155° C. In yet another embodiment, the insulating layer displays a creep of less than or equal to about 3% when subjected to a deforming force of 10 kilo-pounds per square inch (10 kpsi) (about 700 kilogram-force/square centimeter) for 1000 hours at 155° C.

The insulating layer comprising the elastomer displays substantially no creep when subjected to prevailing tensile or compressive stresses at prevailing temperatures in an electrical generator that has been operating for a period of over 24 hours. This ability of the insulating layer to avoid creep at elevated temperatures makes it useful on stator bars and other pieces of equipment used in electrical generators.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An article comprising:
   an electromagnetic device; and
   a groundwall insulation coating disposed upon the electromagnetic device, wherein the groundwall insulation coating comprises a thermosetting polymer and a nanosized filler wherein the nanosized filler comprises a combination of metal oxide and diamond nanoparticles in the form of spheres that have an average largest dimension of less than or equal to about 200 nanometers wherein the metal oxide has the formula (II)

$$(MeO)_x(Fe_2O_3)_{100-x} \quad (II)$$

where MeO is any divalent ferrite forming metal oxide or a combination comprising two or more divalent metal oxides, and "x" is less than 50 mole percent; and
   wherein the article does not comprise a mica tape or slot liner.

2. The article of claim 1, wherein the cured coating has an elongation of greater than or equal to about 200%, as measured in a tensile test at room temperature.

3. The article of claim 1, wherein the thermosetting polymer comprises polyurethanes, epoxies, phenolics, silicones, polyacrylics, polycarbonates polystyrenes, polyesters, polyamides, polyamideimides, polyarylates, polyarylsulfones, polyethersulfones, polyphenylene sulfides, polysulfones, polyimides, polyetherimides, polytetrafluoroethylenes, polyetherketones, polyether etherketones, polyether ketone ketones, polybenzoxazoles, polyoxadiazoles, polybenzothiazinophenothiazines, polybenzothiazoles, polypyrazinoquinoxalines, polypyromellitimides, polyquinoxalines, polybenzimidazoles, polyoxindoles, polyoxoisoindolines, polydioxoisoindolines, polytriazines, polypyridazines, polypiperazines, polypyridines, polypiperidines, polytriazoles, polypyrazoles, polycarboranes, polyoxabicyclononanes, polydibenzofurans, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, or a combination comprising at least one of the foregoing thermosetting polymers.

4. The article of claim 1, wherein the thermosetting polymer has the structure (I)

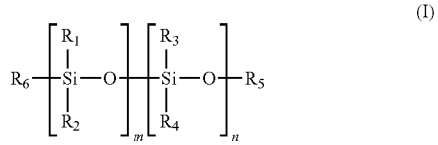

wherein $R_1$, $R_2$, $R_3$, $R_4$, $R_5$ and $R_6$ are the same or different and wherein at least one of $R_1$, $R_2$, $R_3$, $R_4$, $R_5$ and $R_6$ is a reactive functionality prior to cross linking; m and n can be any integer including 0, with the exception that both m and n cannot both be 0 at the same time.

5. The article of claim 4, wherein the sum of m and n is about 1 to about 50,000.

6. The article of claim 4, wherein $R_1$, $R_2$, $R_3$, $R_4$, $R_5$ and/or $R_6$ are reactive functional groups and comprise alkyl, aryl, araalkyl, fluoroalkyl, vinylalkyl, aminoalkyl, vinyl, epoxy, hydride, silanol, amine, carbinol, methacrylate, acrylate, mercapto, haloalkyl, halogen, carboxylate, acetoxy, alkoxy, or a combination comprising at least one of the foregoing functional groups.

7. The article of claim 4, wherein the thermosetting polymer has a number average molecular weight of about 75 to about 500,000 g/mole prior to crosslinking.

8. The article of claim 4, wherein the thermosetting polymer is further mixed with a silane.

9. The article of claim 8, wherein the silane is a chlorosilane, vinylsilane, vinylalkoxysilane, alkylacetoxysilane or a combination comprising at least one of the foregoing silanes.

10. The article of claim 1, wherein the insulating layer comprises a thermosetting polymer in an amount of about 50 to about 98 wt %, based on the total weight of the insulating layer.

11. The article of claim 1, wherein the cured coating displays a creep of less than 10% of its original length when subjected to a tensile or compressive force of greater than or equal to about 100 kilograms/square centimeter for a time period of up to about 24 hours at room temperature.

12. The article of claim 1, wherein Me represents a metal, and wherein the metals are iron, manganese, nickel, copper, zinc, cobalt, magnesium, calcium, or a combination comprising at least one of the foregoing metals.

13. The article of claim 1, wherein the metal oxide nanoparticle has the formula $Ni_{0.5}Zn_{0.5}Fe_2O_4$.

14. The article of claim 1, wherein the nanosized filler further comprises mineral fillers, and wherein the mineral fillers are asbestos, ground glass, kaolin, silica, calcium silicate, calcium carbonate, magnesium oxide, zinc oxide, aluminum silicate, calcium sulfate, magnesium carbonate, sodium silicate, barium carbonate, barium sulfate, mica, talc, alumina trihydrate, quartz, wollastonite or a combination comprising at least one of the foregoing mineral fillers.

15. The article of claim 14, wherein the mica comprises anandite, annite, biotite, bityte, boromuscovite, celadonite, chernikhite, clintonite, ephesite, ferri-annite, glauconite, hendricksite, kinoshitalite, lepidolite, masutomilite, muscovite, nanpingite, paragonite, phlogopite, polylithionite, preiswerkite, roscoelite, siderophillite, sodiumphlogopite, taeniolite, vermiculite, wonesite, zinnwaldite or a combination comprising at least one of the foregoing micas.

16. The article of claim 1, wherein the diamond nanoparticles have an average particle size of less than or equal to about 50 nanometers.

17. The article of claim 1, wherein the metal oxide particles comprise calcium oxide, cerium oxide, magnesium oxide, titanium oxide, zinc oxide, silicon oxide, copper oxide, aluminum oxide, or a combination comprising at least one of the foregoing metal oxides and one or more nanosized metal carbides comprising silicon carbide, titanium carbide, tungsten carbide, iron carbide, or a combination comprising at least one of the foregoing metal carbides.

18. The article of claim 1, wherein the cured coating has an electrical breakdown strength of greater than or equal to about 1 kilovolt and is corona resistant to an applied voltage of 5000 Volts at a frequency of 3 kilohertz for a time period of over 100 minutes.

19. The article of claim 1, wherein the cured coating displays a creep of less than or equal to about 10% of its original length when subjected to a deforming force of about 700 kilogram-force/square centimeter for 1000 hours at 155° C.

20. The article of claim 1, comprising a stator bar.

21. The article of claim 20, comprising a generator stator bar.

22. The article of claim 20, comprising a motor stator bar.

23. The article of claim 1, comprising an electrical conduction winding.

24. A method of manufacturing an article comprising:
disposing an groundwall insulation coating upon an electromagnetic device, wherein the groundwall insulation coating comprises a thermosetting polymer and a nano-sized filler; wherein the nanosized filler comprises a combination of metal oxide and diamond nanoparticles in the form of spheres that have an average largest dimension of less than or equal to about 200 nanometers wherein the metal oxide has the formula (II)

$$(MeO)_x(Fe_2O_3)_{100-x} \quad (II)$$

where MeO is any divalent ferrite forming metal oxide or a combination comprising two or more divalent metal oxides, and "x" is less than 50 mole percent; and curing the thermosetting polymer wherein the cured coating has a thickness of about 25 to about 300 micrometers and an electrical breakdown strength of greater than or equal to about 0.75 kilovolt and the method does not comprise disposing a mica tape or slot liner on the electromagnetic device.

25. The method of claim 24, wherein the groundwall insulation coating is disposed upon the device by dip coating, spray painting, electrostatic painting, brush painting, spin coating or a combination comprising at least one of the foregoing methods.

26. The method of claim 24, wherein the curing of the thermosetting polymer is conducted at a temperature of about 100 to about 250° C.

27. An article manufactured by the method of claim 24.
28. The article of claim 27, comprising a stator bar.
29. The article of claim 28, comprising a generator stator bar.
30. The article of claim 29, comprising a motor stator bar.
31. A method comprising:
feeding a stator bar into a central bore of a die, wherein the central bore is of a configuration sufficient to allow relative movement of the die over the stator bar;
extruding groundwall insulation coating into the die so that it is deposited simultaneously onto each side of the stator bar; wherein the groundwall insulation coating comprises a thermosetting polymer and a nanosized filler; wherein the nanosized filler comprises a combination of metal oxide and diamond nanoparticles in the form of spheres that have an average largest dimension of less than or equal to about 200 nanometers wherein the metal oxide has the formula (II)

$$(MeO)_x(Fe_2O_3)_{100-x} \quad (II)$$

where MeO is any divalent ferrite forming metal oxide or a combination comprising two or more divalent metal oxides, and "x" is less than 50 mole percent; and
traversing the die along an entire length of the stator bar.

32. The method of claim 31, wherein the stator bar is a generator stator bar.

* * * * *

UNITED STATES PATENT AND TRADEMARK OFFICE
CERTIFICATE OF CORRECTION

| | |
|---|---|
| PATENT NO. | : 7,875,347 B2 |
| APPLICATION NO. | : 11/286060 |
| DATED | : January 25, 2011 |
| INVENTOR(S) | : Irwin et al. |

It is certified that error appears in the above-identified patent and that said Letters Patent is hereby corrected as shown below:

In Column 7, Line 28, delete "mm" and insert -- nm --, therefor.

Signed and Sealed this
Seventh Day of June, 2011

David J. Kappos
*Director of the United States Patent and Trademark Office*